(12) United States Patent
Harrand

(10) Patent No.: US 8,803,503 B2
(45) Date of Patent: Aug. 12, 2014

(54) QUICK RESPONSE POWER SUPPLY SWITCHING DEVICE AND POWER SUPPLY NETWORK INCLUDING SUCH A SWITCH

(75) Inventor: Michel Harrand, Saint-Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 569 days.

(21) Appl. No.: 12/670,731

(22) PCT Filed: Jul. 18, 2008

(86) PCT No.: PCT/EP2008/059488
§ 371 (c)(1),
(2), (4) Date: May 4, 2010

(87) PCT Pub. No.: WO2009/016052
PCT Pub. Date: Feb. 5, 2009

(65) Prior Publication Data
US 2010/0213912 A1    Aug. 26, 2010

(30) Foreign Application Priority Data
Jul. 27, 2007    (FR) ..................................... 07 05520

(51) Int. Cl.
*G05F 5/00*    (2006.01)
(52) U.S. Cl.
USPC ......................................... 323/299; 323/303
(58) Field of Classification Search
USPC ................. 323/273–276, 299, 303
See application file for complete search history.

(56) References Cited

U.S. PATENT DOCUMENTS

| | | | |
|---|---|---|---|
| 6,651,138 B2 * | 11/2003 | Lai et al. ....................... | 711/115 |
| 6,804,102 B2 | 10/2004 | Hamon et al. | |
| 7,106,042 B1 * | 9/2006 | Jackson ........................ | 323/275 |
| 2003/0184364 A1 | 10/2003 | Miyagi | |
| 2007/0263419 A1 * | 11/2007 | Sasaki et al. ..................... | 363/49 |

FOREIGN PATENT DOCUMENTS

| | | |
|---|---|---|
| EP | 0 167 884 A2 | 1/1986 |
| WO | 02/057863 A1 | 7/2002 |
| WO | 2005/114667 A2 | 12/2005 |
| WO | WO 2005114667 A2 * | 12/2005 |

OTHER PUBLICATIONS

90nm Low Leakage SoC Design Techniques for Wireless Applications, Philippe Royannez et al., ISSCC2005, paper 7.6, pp. 138 and 139, 2005 IEEE International Solid-State Circuits Conference.

* cited by examiner

*Primary Examiner* — Jue Zhang
(74) *Attorney, Agent, or Firm* — Baker & Hostetler LLP

(57) ABSTRACT

The present invention relates to a quick response power supply switching device. It also relates to a power supply network equipped with such a switch. The electrical power supply is connected to a set of blocks, the device comprises at least one switch (3) connecting the power supply (VDD) and the block (1), the value of the power supply current passing through the switch being controlled according to the difference between the power supply voltage (VDD) at the level of the other blocks and voltage threshold. The invention applies notably to all integrated circuits of recent technology in which it is important to reduce the leakage currents of the transistors in the unused circuit parts. The invention thus applies particularly to most systems powered by cell or battery and more particularly to portable telephone circuits.

10 Claims, 2 Drawing Sheets

QUICK RESPONSE POWER SUPPLY SWITCHING DEVICE AND POWER SUPPLY NETWORK INCLUDING SUCH A SWITCH

CROSS-REFERENCE TO RELATED APPLICATIONS

This application is a National Stage of International patent application PCT/EP08/059,488, filed on Jul. 18, 2008, which claims priority to foreign French patent application No. FR 07 05520, filed on Jul. 27, 2007, the disclosures of which are hereby incorporated by reference in their entirety.

FIELD OF THE INVENTION

The present invention relates to a quick response power supply switching device. It also relates to a power supply network equipped with such a switch.

The invention applies notably to all integrated circuits of recent technology in which it is important to reduce the leakage currents of the transistors in the unused circuit parts. The invention thus applies particularly to most systems powered by cell or battery and more particularly to portable telephone circuits.

BACKGROUND OF THE INVENTION

In integrated circuits of 130 nm or less technology, the transistors exhibit a not-inconsiderable leakage current when they are in the open state. The result of this is electrical consumption in the circuits even when they are inactive. This consumption can be very problematic, notably for circuits powered by cells or batteries, above all when, for most of the time, they are in a standby more or only a small part of the circuit is active. This is particularly true for portable telephones.

One effective technique for reducing this leakage current when the circuit is inactive consists in cutting the electrical power supply to this circuit. Other techniques, notably the one consisting in supplying the substrate or chamber of CMOS circuit with a negative voltage in order to increase the threshold voltage of the NMOS transistors, are possible but more difficult to implement.

One problem in the technique involving cutting the power supply is that, when the power is restored, the inrush current created by the recharging of the capacitance between the power supply gates of a switched block must not cause the power supply voltage to drop upstream of the switch in order to avoid affecting the operation of the other blocks. It is therefore best to limit this inrush current on powering up.

Various solutions are known for limiting this current. In particular, one solution consists in producing a power supply switch consisting of several transistors in parallel with progressive switching of these transistors using a series of delaying circuits. Such a solution is notably described in the document "Techniques for Wireless Applications by Philippe Royannez et al., ISSCC2005, paper 7.6, pages 138 and 139".

In both cases, this switching time is determined by simulation and a significant margin must be taken to take account of the dispersion of the characteristics of the transistors. Because of this margin, the time taken to power up again may be lengthy, preventing these solutions from being used for power-down durations that are too short or in the case where a rapid response from the system is necessary.

SUMMARY OF THE INVENTION

One aim of the invention is notably to allow for a much shorter switching time making it possible to suppress the margin needed for the prior solutions, while not increasing the surface area or footprint of the circuit.

To this end, the subject of the invention is a device for switching a power supply connected to set of blocks, comprising at least one switch connecting the general power supply VDD to that of the block, the value of the power supply current passing through the switch being controlled according to the difference between the power supply voltage VDD at the level of the other blocks and a voltage threshold.

When the power supply voltage passes below the threshold, the switch is, for example, controlled to limit the power supply current passing through it.

Advantageously, this voltage threshold can be greater than the voltage needed to operate the other blocks.

The result of the voltage difference between the power supply voltage VDD at the level of the other blocks and the voltage threshold is, for example, supplied by a differential amplifier, the power supply voltage VDD being connected to an input of the amplifier and the threshold being connected to another input.

Since the switch is a transistor, the output voltage from the amplifier controls, for example, the value of the current passing through the transistor.

If the switch is an MOS P transistor, the power supply voltage VDD is, for example, connected to the negative input of the amplifier and the voltage threshold is then connected to the positive input.

The transistor is, for example, set to the blocked state by cutting off the appropriate electrical power supply terminal of the amplifier. In the case of a switch implemented by an MOS P, the cutting off of the negative power supply for the amplifier provokes the appearance of a positive voltage at the output of the amplifier that blocks the switching transistor.

The amplifier is, for example, connected to the power supply via a transistor, the power supply to the amplifier being cut by setting this transistor to the blocked state.

In another embodiment, the power supply to the amplifier is, for example, cut by cutting the power supply to its foot transistor.

The threshold voltage is, for example, equal to a percentage of a reference voltage VDDref corresponding to the nominal value of the power supply VDD.

Another subject of the invention is a power supply network for a set of blocks. Each block is connected to a power source VDD via a power bus, a block is then connected to the bus via a switching device as described previously.

The power source is, for example, a battery.

BRIEF DESCRIPTION OF THE DRAWINGS

Other characteristics and advantages of the invention will become apparent from the description that follows, given in light of the appended drawings which represent.

DETAILED DESCRIPTION

Figure 1:
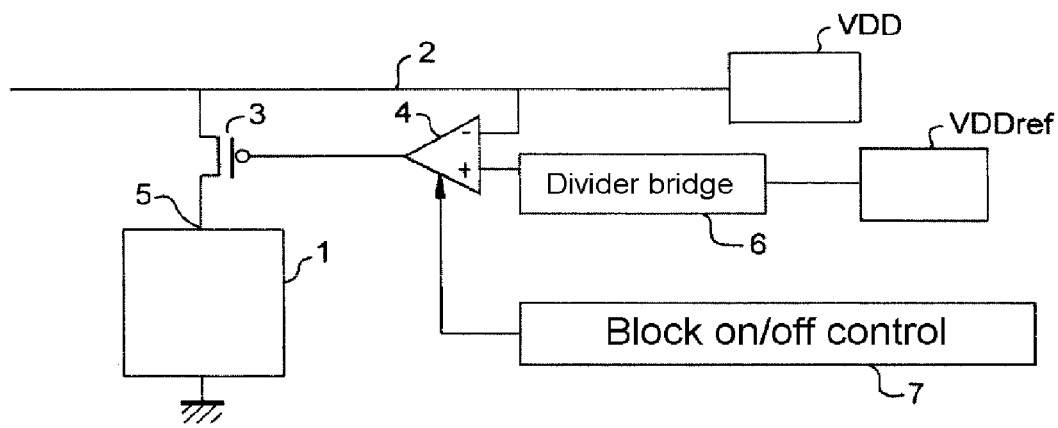
FIG. 1, an illustration of the theory of operation of a device according to the invention.

FIG. 1 illustrates the theory of operation of a device according to the invention.

FIG. 1 shows a block 1 supplied by an electrical voltage VDD. This voltage is, for example, transmitted to several blocks, not shown, by a power bus 2. A block comprises a circuit, analog or digital, corresponding, for example, to a component or to a functional unit comprising several components. Such a block 1, even in the inactive state, can continue to consume an electrical current if it remains electrically connected to the power supply VDD. As indicated previously, an effective solution for preventing this spurious consumption consists in switching off the power supply to the block 1. To this end, a switch 3 is connected between the block 1 and the power supply VDD. The switch is, for example, a field effect transistor. A bipolar transistor could be used. In the example of FIG. 1, when the transistor 3 is in the passing state, the block 1 is supplied at the voltage VDD, to within the drain-source voltage of the transistor. In particular, if Vs is used to denote the power supply voltage at the terminals 5 of the block, Vs=VDD−$V_{DS}$ in which $V_{DS}$ is the voltage between the drain and the source of the transistor. For a bipolar transistor, the voltage $V_{DS}$ would be replaced by the voltage between the collector and the emitter.

To switch off the voltage at the terminals 5 of the block, the transistor 3 is switched to the blocked state, then, to restore the voltage, the transistor is switched to the passing state. A current inrush is then produced at the level of the power supply causing the voltage VDD to drop before it rises again.

According to the invention, instead, notably, of determining an a priori power supply rise time, the switch 3 is controlled so that the voltage outside the block concerned 1 remains greater than the voltage needed to operate the other blocks, by directly comparing this voltage to a reference voltage. If the voltage outside the block 1 is less than a given threshold, the current passing through the switch 3 is limited. The measured voltage is the power supply voltage VDD at the level of the other blocks, and the comparison is then made upstream of the switch 3.

In the exemplary embodiment of FIG. 1, the comparator used is a differential amplifier 4 whose output controls the switch 3 which in this case is a field effect transistor of MOS P type. To this end, the negative input of the differential amplifier 4 is connected to the power supply voltage VDD and the positive input is connected to the reference voltage VDDref, forming the comparison threshold. The reference voltage is, for example, equal to the nominal power supply voltage of the blocks minus 5%, for example 1.05V. The technologies in which the invention can advantageously be used are, for example, technologies in which the power supply is of the order of 1.3 V for the 130 nm technology, 1.1 V for the 65 nm technology.

This reference voltage can be either directly connected to the input of the amplifier 4 or connected via a divider bridge 6. In this case, the divider bridge is used to make a comparison with a threshold corresponding to a percentage of the nominal power supply voltage, and the reference voltage can advantageously be supplied by the power supply voltage of the circuit taken directly from the power supply contacts (or better, a special power supply contact), so as not to be affected by the voltage drops provoked by the currents flowing in the spurious impedances of the power supply network.

The divider bridge can also make it possible notably to obtain, for example, an adjustable threshold at the input of the divider bridge by acting on its parameters, in particular using a variable resistor. In the exemplary embodiment of FIG. 1, the voltage of the input of the differential amplifier 4 and the output of the divider bridge 6 is substantially equal to 95% of the reference voltage VDDref. Since the transistor 3 is of MOS P type, it is controlled to the passing state when its gate-source voltage is negative. This gate voltage is supplied by the output of the differential amplifier 4. If necessary, an interface that is not shown is placed between the output of the amplifier 4 and the gate of the transistor 3.

In steady state operation, the power supply voltage is equal to VDD, greater than 95% of the voltage VDDref, which is itself equal to the nominal power supply voltage. The voltage present at the negative input of the operational amplifier 4, equal to the voltage VDD, is greater than the voltage present at the positive input, equal to 0.95×VDDref. The output of the amplifier is then negative and the transistor 3 is then in the passing state.

To switch off the power supply at the level of the block 1, it is notably necessary to set the transistor 3 to the blocked state. To this end, the device can include a control 7 to switch on the block. This control acts, for example, on the negative power supply of the amplifier 4. In particular to switch off the control of the transistor 3, the power supply to the amplifier 4 is, for example, switched off by means of the abovementioned control 7. The power supply to the block 1 is restored when the power supply to the amplifier 4 is restored. The transistor 3 then switches back to the passing state.

When this switching restores the power supply to the block, if the voltage VDD, shared with the other blocks, remains greater than the given threshold, 0.95×VDDref for example, there is no power supply drop problem. The voltage at the ouput of the amplifier 4 controlling the gate of the transistor 3 remains less than VDD, leading to a gate-source voltage of the transistor 3 that is negative. However, in the general case, the voltage drops. In this case, if the voltage VDD passes below 0.95×VDDref, the voltage present at the positive input of the amplifier becoming greater than the voltage present at the negative input, the output voltage of the amplifier becomes positive, and proportional to the difference VDDref−VDD. The current passing through the transistor 3 is then limited, the limitation increasing with the difference VDDref−VDD.

When the power supply voltage Vs at the terminals 5 of the block 1 once again approaches the general power supply voltage VDD, the current inrush decreases and the transistor can be rendered more passing. Then, when the voltage VDD returns above 0.95×VDDref, the transistor reverts to the nominal passing state. In practice, if the differential amplifier has sufficient gain, the current in the transistor 3 is thus regulated so that the voltage drop on VDD is exactly 5% during almost half the charging time of the spurious capacitance of the power supply gate of the block 1.

Advantageously, a device according to the invention makes it possible to switch the block 1 as quickly as possible without the external power supply voltage VDD dropping more than 5% of the nominal reference voltage VDDref, in the case where this threshold has been set to 95% of VDDref. Other settings are, of course, possible.

If the other blocks are also connected to the power supply VDD by a switch, the voltage internal to the switch, for example $V_{DS}$, is taken into account for the comparison. In other words, the external power supply voltage at the level of these blocks concerned takes account of the internal voltages of the switches used.

Figure 2:
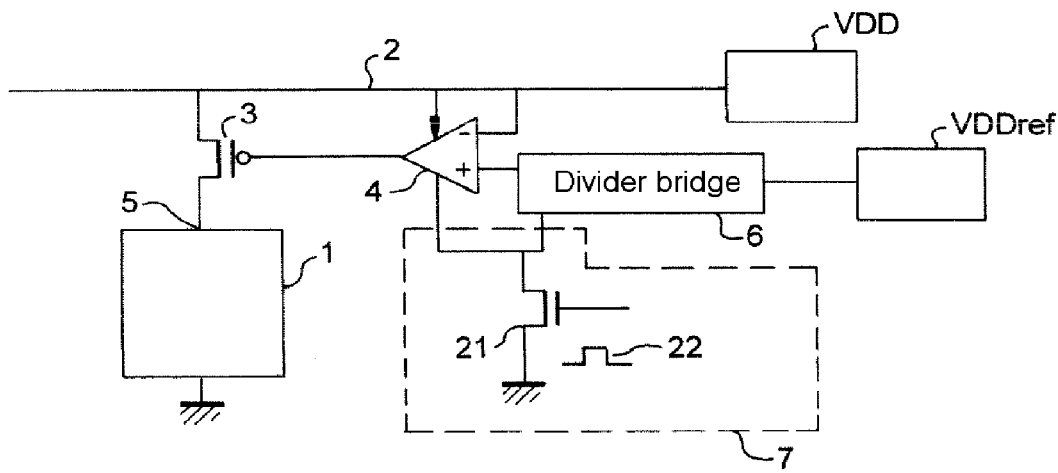
FIG. 2, an exemplary embodiment of a device according to the invention.

FIG. 2 shows a possible embodiment with an exemplary implementation of the control 7 of the transistor 3. This control comprises a transistor 21, for example a field effect transistor, connecting the low power supply of the amplifier 4 and that of the divider bridge 6 to the zero potential, notably the frame ground. The transistor 21 is itself controlled by a control voltage 22. In this case, the cutting, or switching off of the block, is done very simply by blocking the control transistor 21 which then cuts the low power supply to the amplifier and that of the divider bridge. In this state, the output voltage of the amplifier can be only the voltage VDD blocking the MOS P transistor 3 switching the power supply to the block, the voltage VDD being the high power supply voltage of the amplifier 4. The current flowing in the circuit 7 is low enough for it not to be necessary to take particular precautions when switching it on. This solution notably has the advantage of also cutting the leakage currents of the differential amplifier 4.

Figure 3:
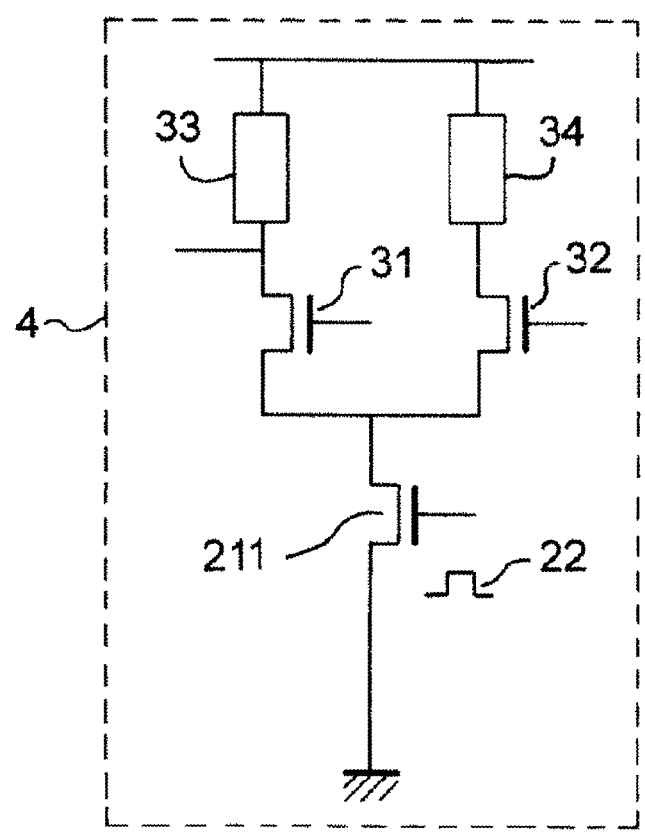
FIG. 3, a variant of one of the elements of the exemplary embodiment given by FIG. 2.

FIG. 3 shows a variant embodiment in which the foot transistor 211 of the differential amplifier is used. In this variant embodiment, the already existing foot transistor 211 of the differential amplifier is cut to cut its power supply, instead of adding the transistor 21 in series as illustrated in FIG. 2. FIG. 3 shows a typical structure of a differential amplifier. The latter comprises two transistors 31, 32 in parallel, for example of MOS type, connected by their drain, via a load resistor 33, 34, to the voltage VDD and by their sources to the drain of the foot transistor 211. The inputs of the amplifier are formed by the gates of the transistors 31, 32. The source of the foot transistor is connected to ground and its gate is controlled by the control voltage 22. The load resistors 31 and 32 can be produced by means of transistors.

A dual solution as shown in FIGS. 1 and 2 is of course possible. In this dual solution the negative power supply (ground) of the block 1 is switched by an MOS N transistor, the inputs of the voltage VDD and of the voltage VDDref being reversed on the amplifier.

The invention claimed is:

1. A device for switching a power supply connected to a set of blocks, comprising:
  at least one switch connecting the power supply and a block of the set of blocks, wherein a value of a power supply current passing through the at least one switch being controlled according to a difference between voltage potential of the power supply at a level of other blocks of the set of blocks and a voltage threshold,
  wherein when a voltage potential of the power supply passes below the voltage threshold, the at least one switch is controlled to limit the power supply current passing through it, and
  wherein the voltage threshold is greater than voltage needed to operate the other blocks of the set of blocks.

2. The device as claimed in claim 1, wherein result of the difference between the voltage potential of the power supply at the level of the other blocks and the voltage threshold is supplied by a differential amplifier, the voltage potential of the power supply being connected to an input of the differential amplifier and the voltage threshold being connected to another input.

3. The device as claimed in claim 2, wherein, the at least one switch being a transistor, the output voltage from the differential amplifier controls the value of the current passing through the transistor.

4. The device as claimed in claim 3, wherein the at least one switch is an MOS P transistor, the voltage potential of the power supply is connected to a negative input of the differential amplifier and the voltage threshold is connected to a positive input.

5. The device as claimed in claim 3, wherein the MOS P transistor is set to a blocked state by cutting the power supply to the differential amplifier.

6. The device as claimed in claim 5, wherein the differential amplifier is connected to the power supply via a transistor, the power supply to the differential amplifier being cut by setting the transistor to the blocked state.

7. The device as claimed in claim 5, wherein the power supply to the differential amplifier is cut by cutting the power supply to its foot transistor.

8. The device as claimed in claim 1, wherein the voltage threshold is equal to a percentage of a reference voltage corresponding to a nominal value of the power supply.

9. A power supply network for a set of blocks, wherein each block of the set of blocks is connected to a power source via a power bus, a block being connected to the power bus via a switching device as claimed in claim 1.

10. The power supply network as claimed in claim 9, wherein the power source is a battery.

* * * * *